(12) United States Patent
Krol et al.

(10) Patent No.: US 11,040,525 B2
(45) Date of Patent: Jun. 22, 2021

(54) METHOD FOR EMBOSSING MICRO-STRUCTURES AND/OR NANO-STRUCTURES

(71) Applicant: EV Group E. Thallner GmbH, St. Florian am Inn (AT)

(72) Inventors: Jozsef Krol, Passau (DE); Boris Povazay, Vienna (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 154 days.

(21) Appl. No.: 16/463,092

(22) PCT Filed: Oct. 23, 2017

(86) PCT No.: PCT/EP2017/076978
§ 371 (c)(1),
(2) Date: May 22, 2019

(87) PCT Pub. No.: WO2018/103940
PCT Pub. Date: Jun. 14, 2018

(65) Prior Publication Data
US 2020/0070496 A1    Mar. 5, 2020

(30) Foreign Application Priority Data

Dec. 6, 2016 (DE) .................... 10 2016 123 538.5

(51) Int. Cl.
*B41F 19/02* (2006.01)
*G03F 7/00* (2006.01)
*B82Y 40/00* (2011.01)

(52) U.S. Cl.
CPC .......... *B41F 19/02* (2013.01); *B82Y 40/00* (2013.01); *G03F 7/0002* (2013.01)

(58) Field of Classification Search
None
See application file for complete search history.

(56) References Cited

U.S. PATENT DOCUMENTS

| 5,425,848 | A | 6/1995 | Haisma et al. |
| 9,764,511 | B2 | 9/2017 | Kreindl et al. |
| 2008/0229950 | A1 | 9/2008 | Mei et al. |

(Continued)

FOREIGN PATENT DOCUMENTS

| DE | 10 2015 120 535 A1 | 6/2017 |
| EP | 2 761 371 B1 | 8/2015 |

OTHER PUBLICATIONS

International Search Report from corresponding International Patent Application No. PCT/EP2017/076978, dated Apr. 11, 2018.

*Primary Examiner* — Joshua D Zimmerman
(74) *Attorney, Agent, or Firm* — Kusner & Jaffe

(57) ABSTRACT

A method and apparatus for embossing micro-structures and/or nano-structures. The method includes the steps of providing a structured embossing roll having end faces; coupling a crosslinking radiation into the structured embossing roll which is transparent for the crosslinking radiation, wherein the embossing roll functions as a light guide for the coupled in crosslinking radiation; providing a carrier having an embossing compound applied thereto; contacting the embossing roll with the embossing compound; coupling the crosslinking radiation out of the embossing roll; and curing the embossing compound which has been acted upon by the coupled out crosslinking radiation via the embossing roll.

11 Claims, 7 Drawing Sheets

(56) References Cited

U.S. PATENT DOCUMENTS

2012/0070623 A1     3/2012   Hayashibe et al.
2012/0204745 A1     8/2012   Jo et al.
2013/0208251 A9     8/2013   Kobrin et al.

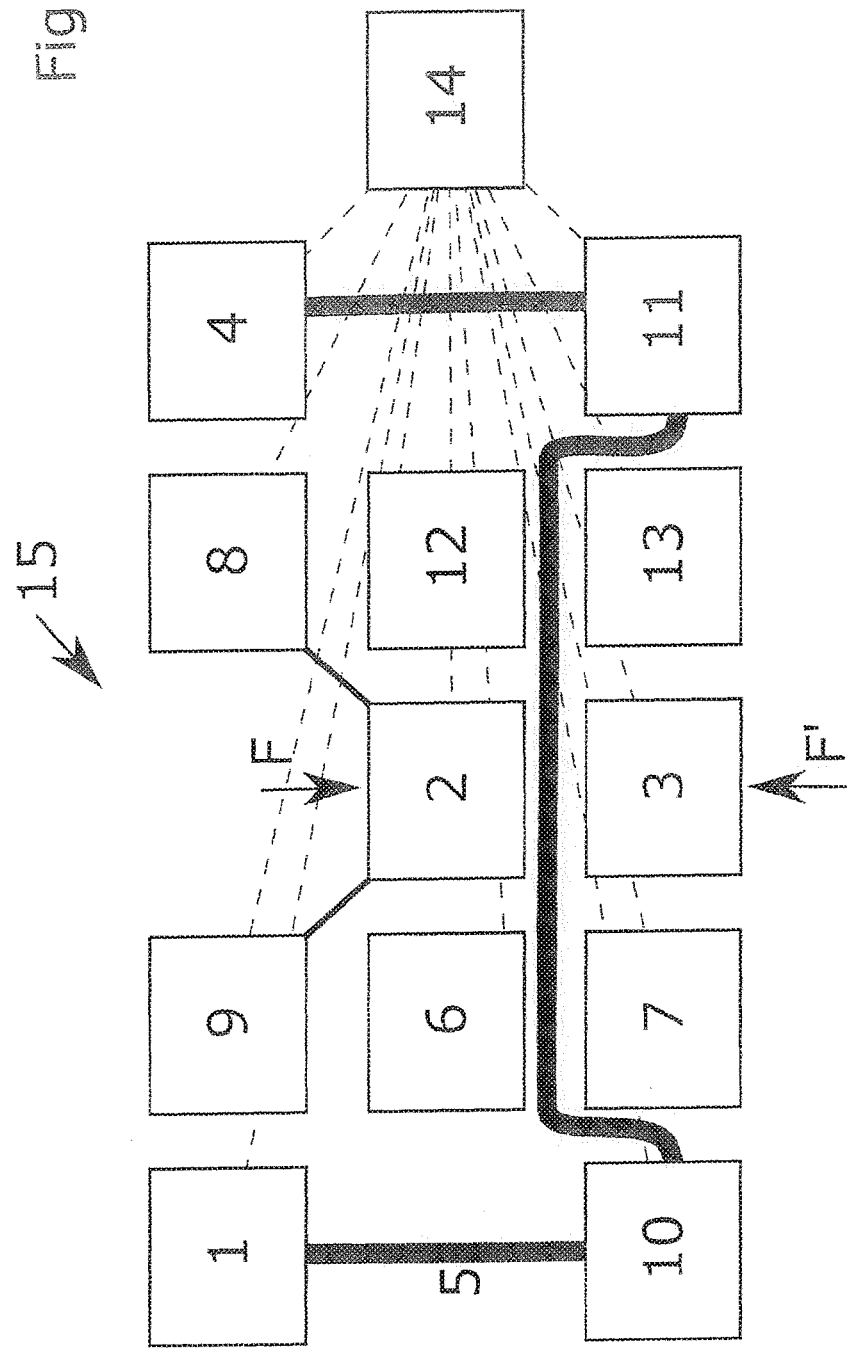

METHOD FOR EMBOSSING MICRO-STRUCTURES AND/OR NANO-STRUCTURES

FIELD OF THE INVENTION

The present invention relates to a method and apparatus for embossing micro-structures and/or nano-structures.

BACKGROUND OF THE INVENTION

A number of different technologies are already known for producing printed strips and films. These have their origins in traditional offset printing, particularly in web offset printing. The medium to be printed, such as paper or film is drawn off from a supply reel, printed continuously with corresponding with print rollers, and rolled up on a receiver reel. Other parts such as tensioning rollers, deflection rollers, drying rollers or coating rollers may be present in the printing press.

A modified form of web offset printing is used in the semiconductor industry for embossing particularly micro- and/or nanostructures on corresponding carriers.

An embossing compound is applied to a carrier, particularly a carrier film, particularly by spraying, laminating or immersion. The embossing compound is processed in a primary forming process with the aid of a structured embossing roll. However, it is possible not to structure the embossing roll itself, and in particular to bring a structured layer (for example for example embossing structures on and/or in an underlay) and the embossing compound into contact. In this way, an unstructured embossing roll, in particular rolls a structure applied onto/into a film into an embossing compound. In order to lend this structuring the dimensional stability it needs, a conversion of substances such as is associated with solidification usually takes place. In most cases, energy is introduced into the embossing compound. This may be effected in particular by means of thermal, UV or microwave radiation, or by treatment in a magnetic, electrical or electromagnetic field. A mechanically induced reaction is also conceivable, particularly when dealing with supercritical, metastable embossing compound, wherein the embossing punch brings about the change in state. In this context, an embossing compound, which may be comprehended as a metastable, statistical many-particle system, may be brought out of the liquid phase and into the solid state by the pressure of the embossing punch or an embossing roll, wherein the effect of the embossing punch only initiates the change of state. It is further possible to control the embossing compound in the temporal progression (curing) in such manner that the form of the embossing compound is no longer changeable immediately after the primary forming. This may be effected with a particularly chemical reaction which is already started in the embossing compound. It may be a reaction of a B-stage materials or the curing of adhesive components such as epoxy resins in the embossing compound, which is known to chemists and materials scientists.

If UV radiation is used for the curing process, the embossing method may be understood as a kind of imprint lithography.

If the embossing compound is shaped by a punch in particular penetrating its structured surface, this is called imprint lithography. If a substance is transferred from the surface of the punch structures, this is called contact lithography. The prefixes micro and nano describe the magnitude of the structures used on the punch.

Typical embossed structure sizes are larger than 10 nm, preferably larger than 50 nm, particularly preferably larger than 500 nm. However, embossed structure sizes of 10 micrometres, 30 micrometres to 1 millimetre or 10 millimetres are possible. For some applications, structure sizes in the order of 100 mm or 1000 mm are possible, particularly for producing displays or self-luminous noticeboards or forgery-proof printed materials such as admission tickets, banknotes.

But it is also conceivable to create structure sizes larger than 1 nm or 5 nm. This requires the corresponding interplay between the method parameters and the equipment parameters. These may be in particular the resist chemistry, the embossing structure geometry and its creation, the embossing system, the purity of the environment.

The technical parameters of the structure sizes represent a limit to cost effectiveness. Although precise structures can be created in a first print with an embossing roll, the production of disparate, high-precision structure whose typical sizes differ from each other by several orders of magnitude is often not possible with a roller.

In order to emboss structures which include disparities of several orders of magnitude, particularly several powers of ten, alternatively a number of embossing rolls particularly connected serially to form an embossing system may be used.

If different embossing roll with different precision specifications are implemented one after the other, the overall resolution and reproducibility may be at least not worsened, in particular improved.

In this situation, synchronisation of the embossing rolls, the pretensioning of the carrier film, the primary and reshaping processes on the embossing compound, the control or computer-assisted regulation thereof are enormously important.

The imprinting systems of the related art are associated with various disadvantages. The thermally adverse position of the UV station in the embossing roll or beside the embossing roll is detrimental to the dimensional accuracy of both the embossing compound and the carrier film, accordingly it is not possible to attain steady thermal states, the unevenness of the heating causes further distortions in the embossing roll and/or in the embossing film. This leads to distortions in the embossed structures, in summary reduced dimensional accuracy.

For imprinting systems with a radiation source positioned in the embossing roll, optical transparency in the wavelength of the radiation is a fundamental prerequisite for functional viability. The fundamental prerequisite of the embossing roll's inherent stability must also be guaranteed, and consequently only materials which have both of these features in combination can be used for this.

For a combined system with a radiation source in the embossing roll, the effort associated with removing the embossing roll maintenance purposes is greater than for systems that do not have integrated functionality. The effort associated with maintaining the radiation source is also greater if the embossing roll is disassembled for this.

SUMMARY OF THE INVENTION

It is therefore the object of the present invention to provide a method and an apparatus which eliminate the disadvantages of the related art, and in particular guarantee improved dimensional accuracy together with reduced maintenance effort.

This object is solved with the features of the independent claims. Advantageous refinements of the invention are described in the subordinate claims. All combinations of at least two of the features presented in the description, the claims and/or the drawing also fall within the scope of the invention. Where value ranges are given, values within the limits identified are also to be considered disclosed as limit values and claimable in any combination.

According to the invention, a method for embossing micro and/or nanostructures is provided which includes the following steps:

Coupling crosslinking radiation into a particularly structured embossing roll which is transparent for the crosslinking radiation, so that the embossing roll serves as a light guide for the coupled in crosslinking radiation, Coupling the crosslinking radiation out of the embossing roll, Curing an embossing compound which is acted upon by the embossing roll with the coupled out crosslinking radiation.

Also according to the invention, an apparatus for embossing micro- and/or nanostructures is provided which includes:

a transmission module for emitting crosslinking radiation, an embossing roll which is transparent for the crosslinking radiation, wherein the crosslinking radiation may be coupled into the embossing roll, so that the embossing roll is usable as a light guide for the coupled in crosslinking radiation, wherein the crosslinking radiation may be coupled out of the embossing roll and an embossing compound which is acted upon by the embossing roll is curable with the coupled out crosslinking radiation.

In another preferred embodiment according to the invention, it is provided that the crosslinking radiation in the embossing roll is homogenised by multiple reflections (total reflection and/or surface reflection).

In another preferred embodiment according to the invention, it is provided that the embossing roll is constructed and built in such manner that its geometry and/or material prevents the crosslinking radiation from escaping the embossing roll except at locations intended for that purpose. This trapping of the crosslinking radiation is called intrinsic confinement. Thus in mathematical terms, the embossing roll geometry together with the material used represents a boundary condition that leads to solutions to Maxwell's equations for electrodynamics which describe a confined crosslinking radiation.

In another preferred embodiment according to the invention, it is provided that the crosslinking radiation is coupled out by scattering sites.

In another preferred embodiment according to the invention, it is provided that the embossing compound is shaped by the embossing roll and the embossing compound is cured by the crosslinking radiation either with minimal temporal delay or simultaneously.

In another preferred embodiment according to the invention, it is provided that an inner shell surface of the embossing roll is conical in shape.

In a further preferred embodiment according to the invention, it is provided that an inner shell surface of the embossing roll has a freeform surface which is optimised for the application of light guidance. This may be represented in particular by surfaces which are exactly describable particularly torically by mathematical functions or determined experimentally.

In a further preferred embodiment according to the invention, it is provided that an inner shell surface of the embossing roll contains reflectors, particularly retroreflectors, or is itself embodied as a reflector, particularly a retroreflector.

In another preferred embodiment according to the invention, it is provided that at least one of the end faces of the embossing roll is furnished with partial mirroring and/or grooves and/or notches and/or indentations for coupling the radiation in.

In another preferred embodiment according to the invention, it is provided that additional optical elements, particularly optical wedges, lenses, prisms, diaphragms and/or mirrors are used for coupling the radiation in.

In another preferred embodiment according to the invention, it is provided that the crosslinking radiation can be coupled in on one side, particularly into one end face of the embossing roll, and opposite end face is totally mirrored.

In another preferred embodiment according to the invention, it is provided that the crosslinking radiation is coupled in on the inner or outer shell surface of the embossing roll, wherein both end faces of the embossing roll may be mirrored. In this context, the coupling in may take place close to the end faces.

In another preferred embodiment according to the invention, it is provided that the outer shell surface of the embossing roll is not cylindrical. In particular, rollable freeform surfaces are possible so that embossing may be performed on concave curved surfaces. In particular, outer shell surfaces that are elliptical or describable by splines may be used as the embossing roll.

The method according to the invention and the systems according to the invention couple the crosslinking radiation, particularly UV radiation, into the embossing roll which is transparent for the crosslinking radiation particularly on at least one of the end faces of the embossing roll. In such a case, the embossing roll is used as a light guide for the crosslinking radiation.

In one embodiment according to the invention, the radiation is coupled out of the embossing roll and simultaneously coupled into the embossing compound to cure it by means of frustrated total reflection.

In another embodiment, the radiation may be coupled out by adapting and adjusting the refractive indices of the embossing roll and embossing compound in such manner that no total reflection takes place at the contact point between the embossing roll and the embossing compound.

In another embodiment, the crosslinking radiation may be coupled out by arranging scattering sites on the shell surface of the embossing roll which is not adjacent to the embossing compound.

The preferably inner shell surface of the embossing roll may be structured, particularly in a periodic pattern. A structuring like the result of sandblasting and/or grinding and/or brushing is conceivable. Thus, the preferably inner shell surface of the embossing roll may be comprehended as an optically disrupted surface which in the form of scattering sites couples the radiation out of the embossing roll in the direction of the outer shell surface of the embossing roll and couples the radiation into the embossing compound. The characteristic structure size of the inner shell surface of the embossing roll for creating scatter sites is in the micrometre to nanometre range, particularly in order of magnitude of the crosslinking radiation wavelength.

Coupling the crosslinking radiation in on at least one end face of the embossing roll eliminates the geometric limitations of the embossing roll in respect of size for the light source, thermal limitations due to uncontrolled heat fluxes, electrical and mechanical couplings for rotating objects, which cause abrasion and are detrimental for imprinting.

Consequently, diameters of the embossing roll and/or material may expediently be designed independently of the type of radiation source.

A further advantage is gained by applying the principle "functional material at function site". This means that the correct functional material is used according to the respective site of the function.

For example, a functional material with very high strength is used for the basic body of the embossing roll, while a functional material with corresponding optical properties assures the necessary functionalisation of the embossing roll surface and the coupling in and coupling out of a directed, homogeneous crosslinking radiation.

In a further embodiment, mechanical and/or thermal and/or fluidic and/or metrological components may be placed particularly within the outer diameter of the embossing roll base body. In particular, drive systems, heating and/or cooling systems together with temperature probes may be functionally integrated in the base body of the embossing roll.

In a further embodiment, the embossing roll may be designed in segments, so that the crosslinking radiation is able to propagate in concentrated manner in the segment used. Consequently, a greater radiation intensity is transmitted into the embossing compound, thereby shortening the curing time and enabling the productivity of the method and the system to be increased.

By repeated total reflection in the embossing roll, it is possible to obtain a homogeneous illumination of the embossing compound. The homogeneity of the illumination by crosslinking radiation of the embossing compound results in uniform crosslinking, which is enormously important for the stability of the method.

For a homogeneous, targeted illumination of the embossing compound, particularly a conical basic shape of the embossing roll is used, wherein the inner shell surface of the embossing roll may be conical in shape. In this way, a clear definition of the position of the embossing roll and therewith closer tolerances may be advantageous. If the inner shell surface of the embossing roll is cylindrical, a lateral displacement on a rigid body can only be defined by means of further structural features such as shoulders or spacers.

A conical cylindrical body, the wedge, may in particular be fixed in self-locking manner in an embossing roll with a conical bore, the taper bore. In this way, except for a rotational degree of freedom necessary for the imprinting all further degrees of freedom are eliminated conclusively—and not overdetermined—by the pairing, which may be considered figuratively as a cone in a taper bore.

A wedgeless embodiment is advantageously provided, which makes replacement of the embossing roll significantly easier. If the limiting case of a wedged shape should occur at the inner cone-cone contact surface, in particular all further fastening means and/or tensioning means for the embossing roll are rendered unnecessary.

The properties of the embossing compound that relate to the flow properties and dimensional stability for imprinting, transparency, absorption behaviour, crosslinking behaviour and crosslinking speed, must be adapted to the imprinting conditions.

The transparent, particularly structured embossing roll must have the lowest possible adhesion property for the embossing compound. Adhesion, also called bond energy density, is preferably defined by the energy per unit area needed to separate two surfaces that are bonded to each other. The energy is expressed in $J/m^2$. The energy per unit area in this context is less than $2.5\ J/m^2$, preferably less than $0.1\ J/m^2$, more preferably less than $0.01\ J/m^2$, particularly preferably less than $0.001\ J/m^2$, more particularly preferably less than $0.0001\ J/m^2$, most particularly preferably less than $0.00001\ J/m^2$. A typical, empirically measured average value of the energy per unit area between a coating material and a polymer is approximately in the order of $0.1\ J/m^2$. A typical, empirically measured average value of the energy per unit area between pure silicon and the same polymer is approximately in the order of $1.2\ J/m^2$.

At the same time, the flow properties of the embossing compound must be adjusted such that the structured outer shell surface of the embossing roll is reproduced without gaps or bubbles. The most important factor in determining the flow property is viscosity. Viscosity is a physical property which depends to a great degree on temperature. Viscosity generally decreases as the temperature rises. At room temperature, the viscosity value is between $10E6\ mPa*s$ and $1\ mPa*s$, preferably between $10E5\ mPa*s$ and $1\ mPa*s$, more preferably between $10E4\ mPa*s$ and $1\ mPa*s$, most preferably between $10E3\ mPa*s$ and $1\ mPa*s$.

The imprinting speed must be selected such that as far as possible no crosslinking of the embossing compound takes place on the roll at all, which would otherwise render the structured embossing roll unusable.

If crosslinking of the embossing compound does occur on the embossing roll and this induces a change in the viscosity, particularly an exponential increase in the viscosity, separability of the embossing compound and the embossing roll must be guaranteed.

When the dimensional stability of the embossed embossing compound is sufficient to enable it to be separated from the embossing roll without crosslinking, crosslinking may take place at a later time, without taking into account the changes in the adhesion properties of the embossing compound.

The lithographic imprinting processes are described as processes that can be directed with recipes. Recipes are collections of optimised parameter values which are related functionally or procedurally. When recipes are used, it is possible to guarantee reproducibility of production sequences. This reproducibility of results is also considered to be one of the definitions of quality.

To ensure the quality of imprint lithography, features must be defined and classified. Quality criteria for all methods and for the systems that execute the methods include the homogeneity of the embossed structures, layer thicknesses, residual layer thicknesses and the absence of flaws in the layer created, accuracy of dimension and shape of the embossed structures, etc.

The quality criteria may be grouped for example under three main headings: input, process and output features.

The input features include for example all carrier film parameter, unchangeable machine parameters, environmental conditions that cannot be influenced, such as the local gravitational constant at the installation site.

The usual carrier films may contain polycarbonate (PC), polymethyl methacrylate (PMMA), polyethylene terephthalate (PET), polystyrene (PS), polyimide (PI), polytetrafluoroethylene (PTFE) or other plastics. Metal films containing aluminium or iron or molybdenum or tungsten or titanium or niobium or zirconium may also be used. It is conceivable to use fibre-reinforced material containing carbon or silicon.

In special cases, it is conceivable to perform imprint lithography on rigid, particularly flat surfaces. The relative movement of the embossing roll and the carrier is used for imprinting. In this way, it is possible to impart structures over the full area, reproducibly and inexpensively to plate glass panes, metal plates or substrates, in particular semiconductors, in particular those containing the following substances or atoms or compounds: GaAs, GaN, InP, InxGa1-xN, InSb, InAs, GaSb, AlN, InN, GaP, BeTe, ZnO, CuInGaSe$_2$, ZnS, ZnSe, ZnTe, CdS, CdSe, CdTe, Hg(1-x)Cd(x)Te, BeSe, HgS, AlxGa1-xAs, GaS, GaSe, GaTe, InS, InSe, InTe, CuInSe$_2$, CuInS$_2$, CuInGaS$_2$, SiC, SiGe, SixNy, Si.

A particularly important parameter for embossing is the thickness and elasticity and/or tensile strength of the carrier film.

The carrier films may have a thickness greater than 10 micrometres, preferably greater than 50 micrometres, particularly preferably greater than 100 micrometres, most particularly preferably greater than 500 micrometres. In theory, it is also possible to print carrier films having thicknesses greater than 1000 micrometres.

The elasticity of the carrier film is a measure of the dimensional accuracy of the embossed structures. If the carrier film is stretched or creased or warped, it is not possible to emboss identical structures. Therefore, the carrier film should have an elasticity less than 10%, preferably less than 5%, particularly preferably less than 1%, optimally less than 0.1%, ideally 0%.

The feed speed is of essential importance for the productivity of an imprinting system. The feed speed may be faster than 0.01 m/min, preferably faster than 0.1 m/min, particularly preferably faster than 0.5 m/min, most particularly preferably faster than 1 m/min, optimally faster than 10 m/min, ideally faster than 20 m/min.

The related art is represented for example U.S. Pat. No. 5,425,848 by. In the standard industrial methods, the radiation for curing may be generated inside the embossing cylinder, and this must be transparent for the radiation. In other standard industrial systems, curing is carried out after the embossing, in an illumination unit.

Process features are understood to refer to all features relating to the application of the embossing compound to the carrier film: for example, carrier films preparation and embossing compound preparation, the application process itself and the post-processing of the embossed structures, which remain attached to the carrier film until the next processing step.

Output features are considered to be all features that have changed the embossing compound by means of lithography imprinting processes, whether these be energetic, material changes or changes to the information content that is/are encoded in the structure geometry/ies for example.

In order to be able to satisfy the quality criteria, it is essential to harmonise all of the input and process features in advance, so that the output features can be attained reproducibly. The nature of this harmonisation therefore influenced strongly by the imprinting equipment, the method and the materials used (embossing compound and carrier film, embossing roll, system materials), and for example the composition of the carrier film, the carrier film material, cleanliness, ambient conditions.

The general method relating to the imprint lithography of embossing compound applied to endless carrier films and which can be performed using imprinting systems, comprises essentially of the following partial steps, wherein known subdivisions of the partial steps are assumed to belong to the generally knowledge of the person skilled in the art.

In a recipe, the process features are grouped together for a specific purpose and the partial steps are produced in a logical combination. The recipes may be provided as instruction sets in a form which is either machine-readable or comprehensible to the operator. The execution of the recipe in order to implement the process features, which takes place on the imprinting machinery, is described here. A description of the preparatory method steps will not be repeated here.

Production of the Embossing Roll

The embossing roll may be produced according to the explanation included in EP2761371. In a further disclosed embodiment according to the invention, a master structured as a negative roll may be created using electron beam lithography, atomic force microscopy, LIGA [lithography, electroplating, moulding] processes or by x-ray beam lithography or other production processes as the first sub-process.

In a second sub-process, the master may be transferred to the outer shell surface of the embossing roll in an embossing method similar to the one disclosed. For this, the master and the embossing roll are rolled relative to each other and crosslinked.

In a third sub-process, at least one of the end faces is functionalised to allow the radiation to be coupled in: Partial mirroring and/or grooves and/or notches may be created. If the radiation is to be coupled in on one side, the opposite end face of the embossing roll can be totally mirrored. With the functionalisation of the radiation coupling, the optical losses between the radiation source and the embossing roll can be minimised, preferably eliminated.

A characteristic of radiation sources is the electrical connected load, which is in the order of 1 W to 10 kW, preferably 100 W to 7 kW, particularly preferably 500 W to 5 kW.

The optical power for radiation sources is usually in the order of 1 mW to 1 kW, preferably 1 W to 1 kW, particularly preferably 100 W to 1 kW.

The difference between electrical connected load and optical power is dissipated as power loss, usually as heat, by corresponding coolants and refrigeration apparatuses, which are known to the person skilled in the art.

Usual wavelengths for the radiation sources are the g and/or h and/or i lines of high pressure mercury arc lamps. These known wavelengths can be generated with any appropriate equipment such as semiconductor lasers or LEDs, other gas discharge lamps. In one exemplary embodiment according to the invention optical converters can be used to convert the wavelength or frequency of the radiation.

In particular, according to the invention it is possible to used radiation sources in the wavelength range from 240 nm up to about 1000 nm that have been adapted to the chemical properties such as crosslinking wavelength(s), viscosity, composition, refractive index, change in refractive index due to curing, glass transition temperature etc. of the embossing compound.

The harmonisation of the chemical properties of the embossing compound and a radiation source, particularly a LED radiation source, preferably having a wavelength of 365 nm, is advantageous due to the high radiation yield with low heat generation.

In a fourth sub-process, the finished embossing roll may be measured particularly optically, preferably using monochromatic, coherent radiation, preferably using speckle interferometry.

EMBODIMENT OF A METHOD ACCORDING TO THE INVENTION

In a first step, the carrier film, in particular rolled up on a reel is mounted in the imprinting system. The preliminary checks such as ensuring that the necessary media (for example compressed air, vacuum, embossing compound) are present, deionising, functionality of the air filters, plausibility of the sensor values for the measurement and control instruments must also be carried out.

In this step, the leader of the carrier film, its initial tension, position, optical transparency can also be checked.

This step may also include inspecting the radiation source, particularly by automated means, to verify that the position, output intensity or other parameters are within the parameter field specified in the recipe. If errors are found, the method according to the invention can be terminated.

In a next step, the embossing compound is applied to the side or to both sides of the carrier film that is/are to be embossed. Optionally, a laminated embossing compound may be used.

In a next step, the radiation is directed into the particularly rotating embossing roll either temporally continuously or at clocked intervals, i.e. intermittently.

In a next step, the embossing compound is formed with the aid of the embossing roll. With minimal time delay or simultaneously, in the fourth step according to the invention the crosslinking of the embossing compound is initiated by the introduction of energy or a change of state, particularly by UV radiation. At this point, it is particularly important to guarantee a homogeneous energy supply. Particularly the optical homogeneity of the UV radiation should be within a value range from 70% to 100%, preferably 80% to 100%, particularly preferably 90% to 100%, most particularly preferably from 95% to 100%.

The energy density of the crosslinking radiation in particular is critical for the embossing result. Accordingly, an energy density between 5 mW/cm$_2$ and 2000 mW/cm$_2$, preferably between 10 mW/cm$_2$ and 1000 mW/cm$_2$, particularly preferably between 100 and 700 mW/cm$_2$ measured through the embossing compound on the embossing film or generally on the substrate is used as the irradiation density.

In a next step, the embossing roll and the embossed carrier film with the finished structures are separated, in particular continuously.

In a next step, the carrier film is rolled up onto a receiving reel for further processing.

In a further development of the method, multiple embossing rolls may act on the embossing compound consecutively.

In another further development of the method according to the invention, two embossing rolls may process the embossing compound that has been applied on both sides, in particular simultaneously. It is also conceivable to separate the embossing rolls spatially, so that each embossing roll is individually able to press the embossing compound with the carrier film against support rollers or support surfaces, which are not described in further detail here.

Further advantages, features and details of the invention will become evident from the following description of preferred embodiments and with reference to the drawing.

BRIEF DESCRIPTION OF THE DRAWINGS

FIG. 5 is a schematic block representation of an apparatus according to the invention.

In the figures, identical components or component with the same function are denoted with the same reference signs.

DETAILED DESCRIPTION OF THE INVENTION

Figure 1A:
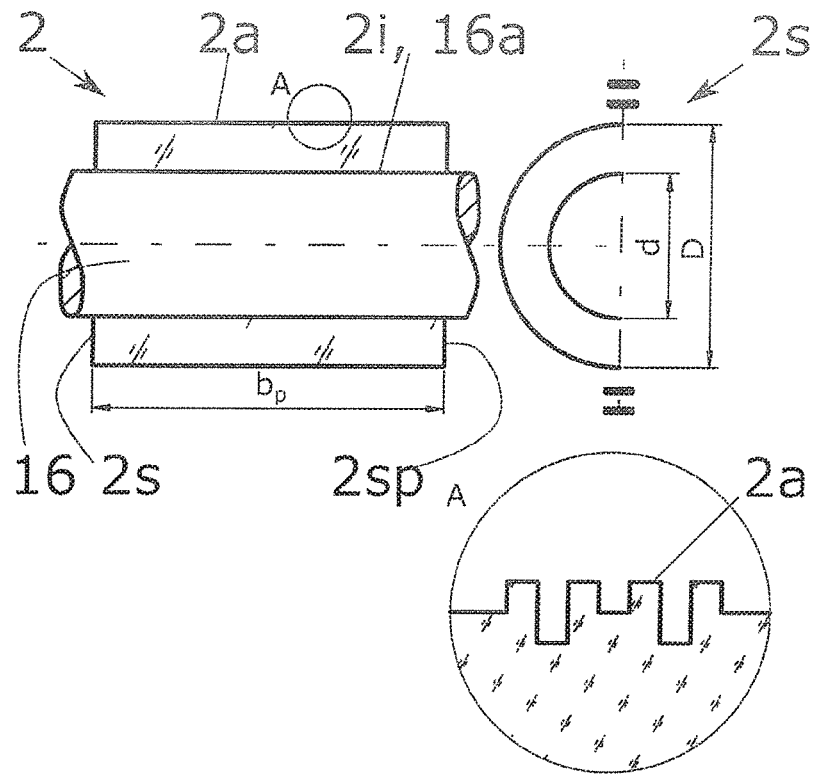
FIG. 1a is a schematic representation of a first embodiment of an embossing roll according to the invention.

FIG. 1a is a schematic representation of a first embodiment according to the invention of an embossing module 2, particularly an embossing roll 2. The diagram on the left represents a plan view, the diagram on the right represents a side view, and underneath is an enlarged view of section A. The embossing roll 2 has a typical width $b_p$, which can be adjusted to the width of a carrier material. On the external diameter D of the embossing roll 2 there is a particularly structured outer shell surface 2a. The outer shell surface 2a may be wider than the typical width $b_p$, which may be considered the embossing width.

The adhesion force between the outer shell surface 2a and the embossing compound is preferably very low. Adhesion is preferably defined by the energy per unit area needed to separate two surfaces that are bonded to each other. The energy is expressed in J/m$^2$. The energy per unit area in this context is less than 2.5 J/m$^2$, preferably less than 0.1 J/m$^2$, more preferably less than 0.01 J/m$^2$, particularly preferably less than 0.001 J/m$^2$, more particularly preferably less than 0.0001 J/m$^2$, most particularly preferably less than 0.00001 J/m$^2$. The low adhesion may be attributable either to the surface properties of the shell material itself, or the shell may be coated with a material that has correspondingly low adhesion.

Section A shows a schematic representation of a structured surface. In other variants, the outer shell surface 2a may also be unstructured.

The shell is comprised of either a very soft or a very hard material. There are various technological parameters for hardness. The correct hardness measurement method depends on many influencing factors. The most important factors are the material that is to be tested and the test body. Metals and ceramic, that is to say bodies with correspondingly high strength and/or corresponding plastic capabilities are mostly but not always tested with hardness methods according to Rockwell, Brinell and Vickers.

Conversion between the individual hardness measurement values is only possible to a limited degree. Tables and formulas for this purpose do exist and are known to the person skilled in the art. But it should be noted that an exact conversion is not always possible, or it is imprecise. The following hardness measurement values reflect hardness according to Vickers.

Vickers hardness for a shell made from a hard material is greater than 10, preferably greater than 100, more preferably greater than 500, particularly preferably greater than 2000, most preferably greater than 4000.

The Vickers hardness for a shell made from a soft material is less than 4000, preferably less than 2000, more preferably less than 500, particularly preferably less than 100, most preferably less than 10.

Elasticity is described with the modulus of elasticity. The shell's modulus of elasticity is between 1 GPa and 1000 GPa, preferably between 10 GPa and 1000 GPa, more preferably between 25 GPa and 1000 GPa, particularly preferably between 50 GPa and 1000 GPa, most preferably between 75 GPa and 1000 GPa. The modulus of elasticity of some steel types is for example in the order of 200 GPa. The modulus of elasticity of $SiO_2$ is between 60 GPa and 80 GPa.

The end face 2s of the embossing roll 2 serves to couple in the crosslinking radiation (also called curing radiation). The other end face 2sp of the embossing roll 2 may be made reflective for greater efficiency. At internal diameter d of the embossing roll 2, the particularly cylindrical inner shell surface 2i couples concentrically with an outer shell surface 16a of a particularly solid cylinder body 16, which determines the shape, stability, and the essential mechanical and thermal properties of the embossing module 2.

Cylinder body 16 may be coupled to the mechanical drive, thermal and/or inductive heaters, sensors such as temperature probes, pressure sensors, deflection sensors, heat sinks such as a cooling system particularly a liquid cooling system, specifically a water cooling system may be accommodated in the interior of the cylinder body 16. These are not shown explicitly in the figure.

The temperature of the embossing roll 2 is preferably kept constant, particularly while the electromagnetic radiation is coupled in. The variation of the temperature of the embossing roll 2 from the desired temperature is less than 10° C., preferably less than 5° C., still more preferably less than 2° C., particularly preferably less than 1° C., most particularly preferably 0° C.

The typical width of the embossing roll bp and the typical bearing length of the cylinder body 16 (not separately identified) may be of the same length. In another embodiment, bp may be shorter than the typical bearing length of the cylinder body 16. In another embodiment, bp may be longer than the typical bearing length of the cylinder body 16.

The optical properties of the embodiments are represented in simplified form here. In outer shell surface 2a of the embossing roll 2 may be understood in optical terms as a boundary surface G. With a refractive index n2, the material of the embossing roll 2 is comprised of a medium M2 which is optically denser than the ambient environment, which contains an optically thinner medium M1 with a refractive index n1, see also FIG. 2a in this regard.

The shell, that is to say the volume body which is delimited by surfaces 2a, 2i, 2s, 2sp, has a transparency greater than 40%, preferably greater than 60%, particularly preferably greater than 80%, most preferably greater than 99.5%, most particularly preferably greater than 99.9%.

In a further, special embodiment according to the invention, if the embossing roll 2 has the requisite properties, it is conceivable to mount a drive unit on the outer shell surface 2a of the embossing roll 2. In this way, the volume portion of an internally hollow embossing roll 2 may be used to accommodate sensor systems or the like. In this case, a cylinder body 16 can be dispensed with.

Figure 1B:
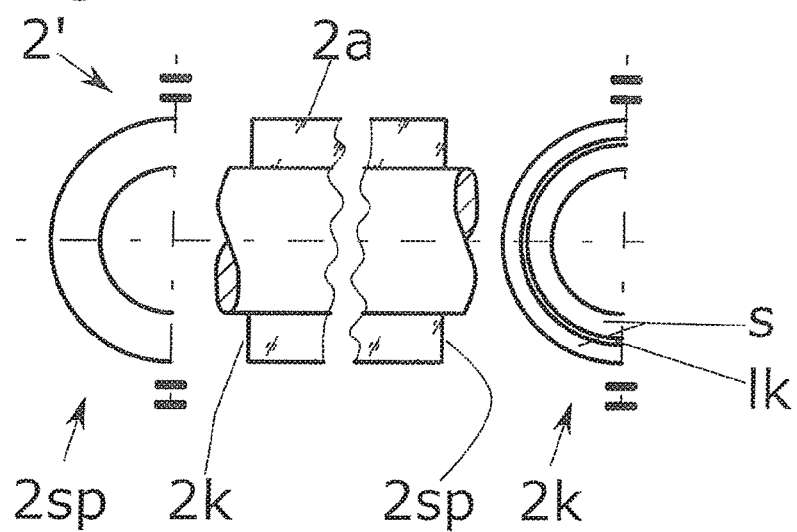
FIG. 1b is a schematic representation of a second embodiment of an embossing roll according to the invention.

FIG. 1b is a schematic representation of a second embodiment of an embossing roll 2' according to the invention. Similarly to FIG. 1a, the embossing roll 2' includes an outer, cylindrical shell surface 2a, which may have the negative of the structures that are to be embossed, but in other embodiments can be restructured. The differences may lie in the end faces of the embossing roll 2': one end face 2sp may be identical with the end face of FIG. 1a, the other end face 2k may include partial mirroring s in the form of concentric circles, wherein a peripheral, non-reflective circular ring lk is used for the light coupling. Due to the at least partial mirroring on both sides of the end faces, this embodiment has a greater optical efficiency through the reduction of undesirable emission losses.

Figure 1C:
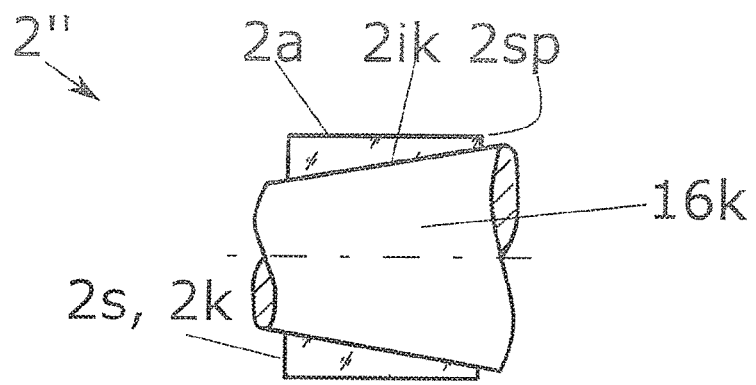
FIG. 1c is a schematic representation of a third embodiment of an embossing roll according to the invention.

FIG. 1c is a schematic representation of a third embodiment of an embossing roll 2" according to the invention. The explanatory notes for FIGS. 1a-1b also apply for this embodiment. The differences include the cylinder body 16 on the outer shell surface 16k is conical. Usual cone angles are greater than 0 degrees, preferably greater than 1 degree, still more preferably greater than 5 degrees, particularly preferably greater than 10 Grad, most particularly preferably greater than 15 degrees. The angles are to be defined according to the decrease in intensity of the embossing roll 2". The inner shell surface 2ik of the embossing roll 2" is constructed with the identical conical curve to the shell surface 16k, resulting in total, uniform osculation between the two surfaces. The outer shell surface 2a of the embossing roll 2" is also cylindrical in shape. In the same way are shown in FIG. 1a or 1b, the end faces may be reflective 2sp, non-reflective 2s or partly reflective 2k.

In another embodiment according to the invention not shown here, it is advantageous if a cylinder body and the embossing roll are connected to each other according to a mathematically describable, optimised freeform surface in a corresponding osculation.

Figure 1D:
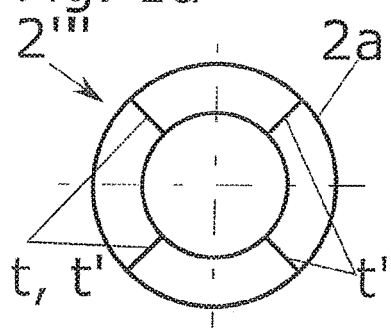
FIG. 1d is a schematic representation of a fourth embodiment of an embossing roll according to the invention.

FIG. 1d is a schematic representation of a fourth embodiment of an embossing roll 2''' according to the invention. Unlike those of FIGS. 1a-1c, the embossing roll 2''' is constructed in segments. The segments are separated from each other by radiation-opaque partitions t, t', t", t''' in such manner that the propagation of the radiation can always be confined to one segment. This may be realised with a modification of the embossing roll 2'''. In a further embodiment, reflective elements in particular may be introduced into the embossing roll 2'''. This enables greater radiation outputs to be coupled in and coupled out, and possible if multiple radiation sources are used with different spectra, different embossing processes.

Figure 1E:
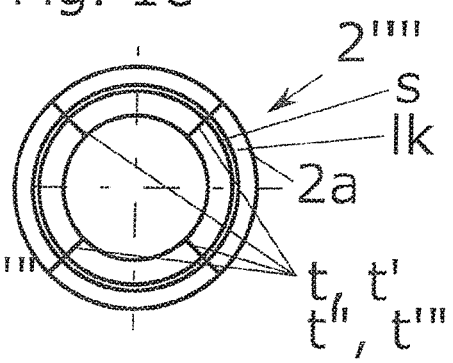
FIG. 1e is a schematic representation of a fifth embodiment of an embossing roll according to the invention.

FIG. 1e is a schematic representation of a fifth embodiment of an embossing roll 2"" according to the invention. In addition to FIG. 1d, similarly to FIG. 1b the ends of the segmented embossing roll 2"" are partially mirrored with reflective portions s and a light coupling portion lk. The number of partitions t, t', t", t''' may be determined from a set M{0, 1, 2, 3, 4, 5, 6, 7, 8, 9, 10, more than 10}.

The outer shell surface of the embossing roll 2"" may be structured or unstructured.

Figure 1F:
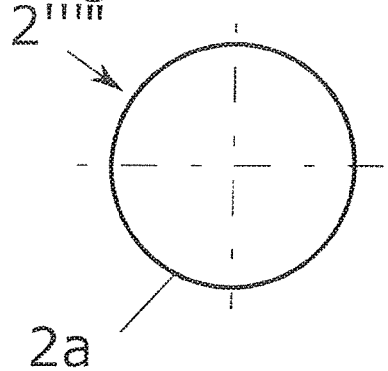
FIG. 1f is a schematic representation of a sixth embodiment of an embossing roll according to the invention.

FIG. 1f is a schematic representation of a sixth embodiment of an embossing roll 2""' according to the invention, wherein the embossing roll 2'''''' is constructed as a solid body without a core. However, it is possible to define other pressure bodies as embossing roll 2'''''' which are not roll-shaped but in the form of a punch, which do rely on a linear rather than a rolling motion for embossing. Correspondingly, the outer shell surface of the embossing roll 2'''''' may be transformed into a flat punch surface.

Figure 1G:
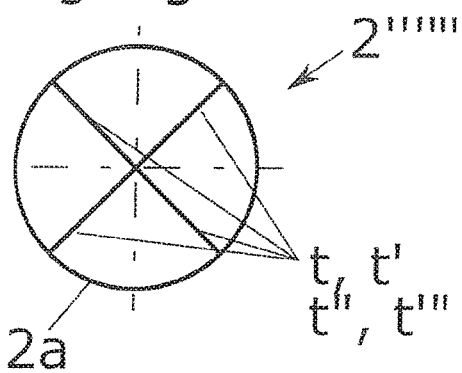
FIG. 1g is a schematic representation of a seventh embodiment of an embossing roll according to the invention.

FIG. 1g is a schematic representation of a seventh embodiment of an embossing roll 2'''''' according to the invention, which may be comprehended as a combination of FIG. 1d and FIG. 1f or FIG. 1e. Accordingly, the embossing roll 2'''''', in particular the outer shell surface of the embossing roll 2'''''' includes parts which are separated from each other by partitions t, t', t'', t'''. The features described there apply similarly.

Figure 1H:
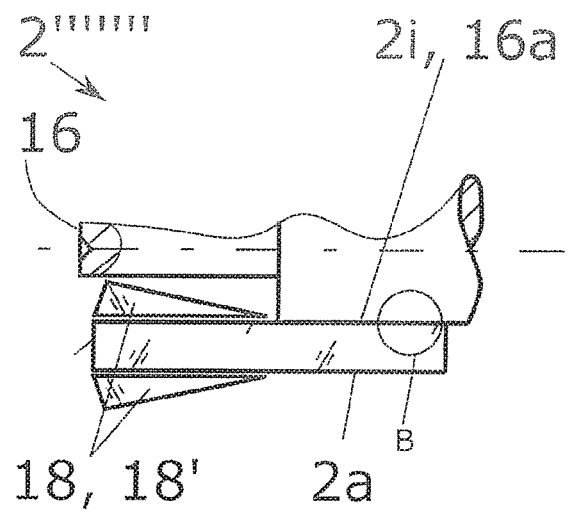
FIG. 1h is a schematic representation of an eighth embodiment of an embossing roll according to the invention.
Figure 1H:
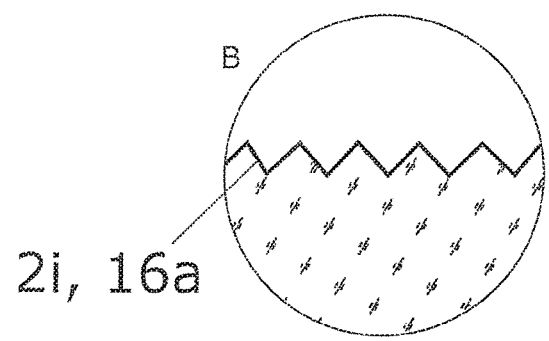

FIG. 1h is a schematic representation of a eighth embodiment of an embossing roll 2'''''''' according to the invention. Optical elements 18 at and/or close to the inner functional shell surface 2i of the embossing roll are depicted particularly as optical wedges for coupling the radiation in and shaping the beam when coupling the radiation beam in. The radiation may preferably be coupled in by frustrated total reflection. The cylinder body 16 may be shaped correspondingly, so that the crosslinking radiation can be coupled into the functional layer of the embossing roll.

The cylinder body 16 and/or the inner functional shell surface 2i of the embossing roll may also be structured. For the structures, particularly retroreflectors, cat's eye structures may be used for internal guidance of the total reflection(s) or the surface reflection(s). The typical size of the individual structures is larger than 0.1 mm, preferably larger than 0.5 mm, more preferably larger than 1 mm, particularly preferably larger than 2 mm, ideally larger than 5 mm. Alternatively, it is conceivable to use reflectors which are smaller than 0.1 mm or larger than 10 mm.

The aperture angle of the retroreflectors may be designed to be in the order of 0.01° to 180°, depending for practical purposes on the crosslinking radiation and the structure sizes. Preferred angles for retroreflectors are 90°+/−5°. The calculations are known to the person skilled in the art. In a further embodiment according to the invention, the crosslinking radiation may be coupled into the outer functional shell surface 2a of the embossing roll.

In a further embodiment according to the invention, parallel coupling of the crosslinking radiation is conceivable in principle, then the radiation is coupled into both the inner functional shell surface 2i and the outer functional shell surface 2a.

Figure 2A:
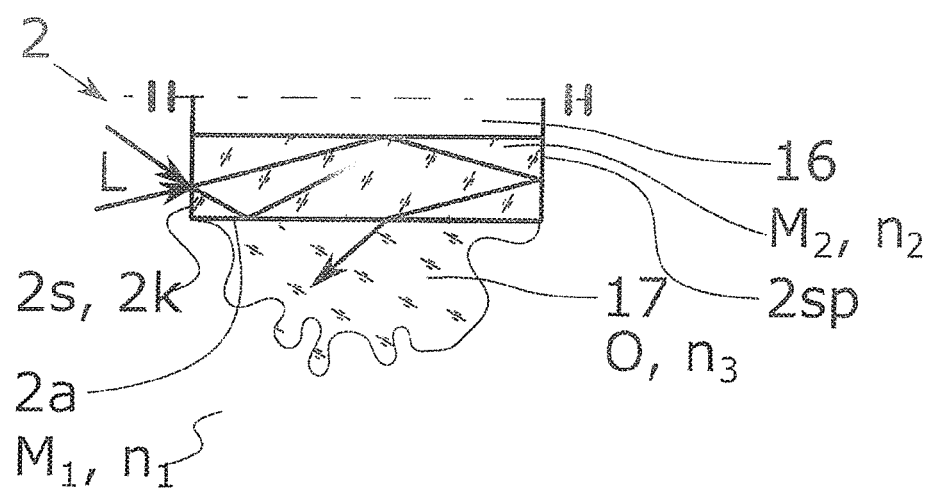
FIG. 2a is a schematic representation of an embodiment according to the invention using frustrated total reflection.

FIG. 2a is a schematic representation of an embodiment according to the invention using frustrated total reflection. Here, the embodiment of FIGS. 1a-1h is supplemented with exemplary beam paths L. The repeated total reflection with particularly widened beams is represented schematically, wherein a homogeneous illumination of the embossing roll and the homogeneous coupling out of the radiation take place in the embossing compound 17. The embossing roll 2 further includes the cylinder body 16, the end faces for coupling in 2k, 2s and reflective end face 2sp. The embossing compound 17 is represented symbolically, without proportionality, wherein the radiation entry is also illustrated. The inner shell surface is reflective or else radiation-opaque due to total reflection.

Figure 2B:
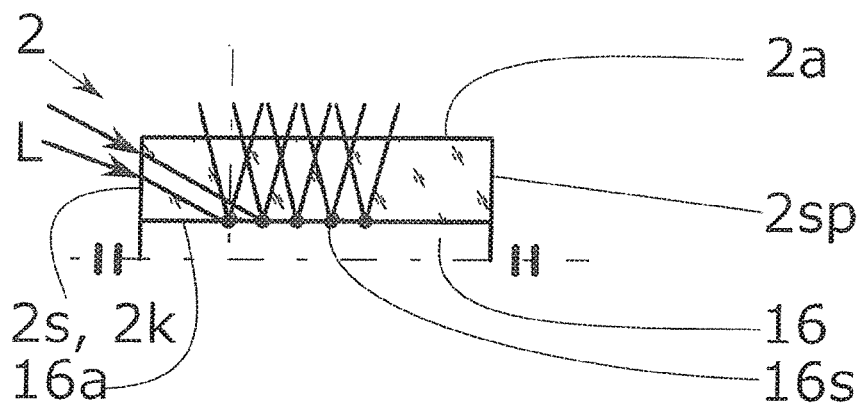
FIG. 2b is a schematic representation of an embodiment according to the invention using coupling out with disruption sites.

FIG. 2b is a schematic representation of an embodiment according to the invention using coupling out with disruption sites. The embossing roll 2 disclosed according to the invention is used in an embodiment as represented for exemplary purposes in FIGS. 1a-1h. The radiation is coupled in similarly to the manner shown in the earlier figures.

In order to keep the illustration clear, the beam path inside the embossing roll is not shown represented in its entirety. The embossing compound which comes into contact with the outer cylinder shell surface of the embossing roll is not shown. The coupling in of the beam is indicated by L. A stochastic beam path inside the embossing roll is not represented. Coupling out by means of disruption (scattering) sites 16s with statistically evenly distributed cones for coupling out radiation are only represented schematically.

The homogeneity of the coupled out radiation is determined by the parameters of distribution, shape and size of the disruption sites. It is assumed that the person skilled in the art will be familiar with the design of the disruption sites. Disruption sites may be interpreted as scatter centres.

The shell surface 16a of the cylinder body 16 is not polished or lapped, i.e. the surface quality is not enhance, instead it is furnished with disruption sites 16s. These may particularly have the form of a brushed surface. Structuring tracks from sandblasting or etched grain boundaries may be provided in targeted manner.

It is permissible for the surface 16a to have stochastically evenly distributed fine periodic deviations from the mathematically optimal surface form, though these should be in the same order of magnitude as the radiation wavelength. This enables a homogeneous illumination of the embossing compound to be achieved. The beam path of the radiation L is to be understood as represented in FIG. 2a.

Figure 3A:
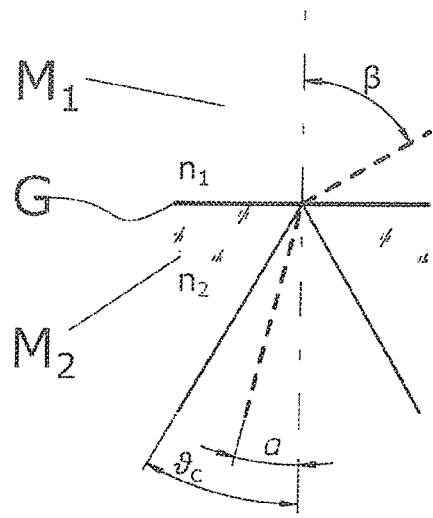
FIG. 3a is a schematic representation of a total reflection.

FIG. 3a is a schematic representation of the total reflection and the intensity gradient at a boundary surface G. Here, the simplified basic principles of geometrical optics are used. Thus, a critical angle $\vartheta c$ is created at the exit of a light beam from an optically denser medium M2 having refractive index n2 into an optically thinner medium M1 with refractive index n1, above which total reflection takes place and no radiation is coupled out into the optically thinner medium. These rules are known to engineers and physicists who specialise in the field. A beam path of an oblique beam is also shown, which is refracted by angle $\alpha$ to the perpendicular in the denser optical medium, that is to say by angle $\beta$ to the perpendicular at the output.

Figure 3B:
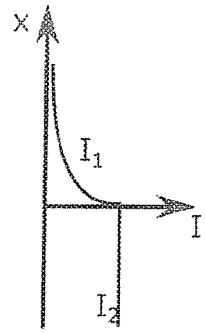
FIG. 3b is a schematic representation of an intensity gradient on a boundary surface.

The diagram of FIG. 3b beside FIG. 3a shows an intensity distribution of a totally reflected beam, wherein the intensity I is represented not to scale as a function of the perpendicular distance x from the surface.

The intensity of the totally reflected beam in the optically denser medium M2 is represented as constant having value I2. Close to the boundary surface, a wave-optical phenomenon known to the person skilled in the art, the "light-skin" appears. Accordingly, the intensity I1 in medium M1 with refractive index n1 is proportional to the reciprocal of exponential function e. This is due to evanescent waves.

FIG. 3b is a schematic representation of the qualitative intensity gradient I1 of the evanescent wave and the intensity gradient $I_2$ of the totally reflected beam at a boundary surface G.

Figure 3C:
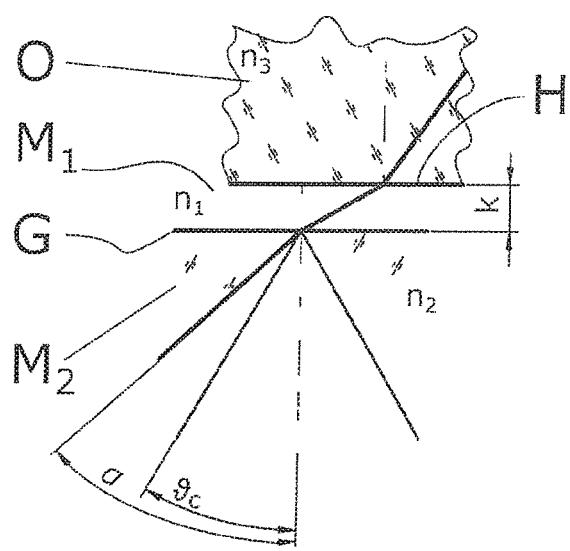
FIG. 3c is a schematic representation of a frustrated total reflection.

According to FIG. 3c, an object O with refractive index n3 is positioned close to boundary surface G, at a distance k. The refractive index n1 is less than the refractive index n3. If the distance k is small enough (zero or larger), the object O with refractive index n3 is located inside the light-skin. In this way, at least some of the radiation (assuming the corresponding absorption properties) is absorbed by O. This makes it possible to couple the totally reflected radiation out of medium M1 and into O.

Figure 3D:
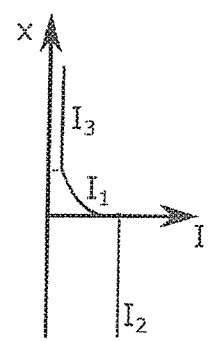
FIG. 3d is a schematic representation of an intensity gradient on a boundary surface using frustrated total reflection.

An intensity distribution of a frustrated totally reflected beam is only represented qualitatively in FIG. 3d, the intensity I being represented as a function of propagation direction x.

In medium M2, the intensity $I_2$ is treated as constant. After the boundary surface G, the intensity in medium M1 with having refractive index n1 is proportional to the reciprocal of exponential function e. At boundary surface H, residual intensity $I_3$ is coupled into the medium O and transmitted apparently as constant in medium O.

Figure 4:
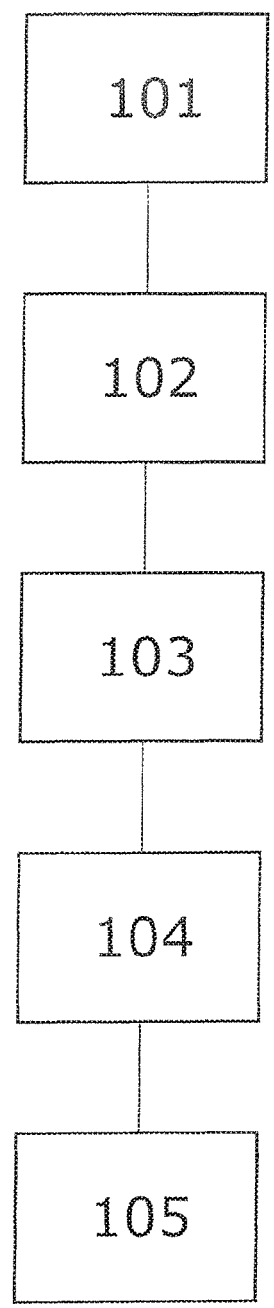
FIG. 4 is a schematic block representation of the sequence of a method according to the inventions.

FIG. 4 is a schematic block representation of an imprinting method according to the invention.

In the first step 101, the radiation is coupled into the embossing roll.

In the second step 102, a contact between the embossing compound and the embossing roll is initiated.

In the third step 103, the radiation is coupled out of the embossing roll accompanied simultaneously by coupling the radiation into the embossing compound. In this way, curing is initiated.

In the fourth step 104, the embossing roll is separated from the embossing compound.

In the fifth step 105, the embossing roll is cleaned and prepared for the repeated embossing continuously, so that in particular step 101 can be initiated again.

Steps 101 and 102 may also be swapped with each other.

FIG. 5 is a representation of the functional sequence of an imprinting system according to the invention. The imprinting system 15 is comprised of a combination and coupling of the described modules: The carrier material 5, particularly a carrier film, passes through the embossing method from a transmission module 1 to the receiver module 4. The embossing takes place at and/or in the embossing module 2, which may be embodied as an embossing roll. An embossing force F is applied and is absorbed in particular by a support module 3, wherein this is indicated generically by a counterforce F'.

Drives 8 (motors with or without a gearbox) are used to generate the relative movement between embossing compound and embossing module, particularly an embossing roll. In particular, the carrier film with the embossing compound and the embossing roll may roll over each other. Further force and pressure generating elements 8 may generate the force (pressure). This may be generated hydraulically and/or pneumatically and/or mechanically and/or electronically and/or electromagnetically.

In order to generate the curing radiation, a radiation module 9 is coupled with the embossing module. The radiation module may contain at least one radiation source (LED or LED array, or mercury vapour lamp, or halogen spotlights, or lasers, or magnetrons, or other drift tubes), beam-shaping elements such as mirrors, semi-translucent mirrors, lenses, prisms, light guides, diaphragms, further auxiliary units such as a cooling system.

After the transmission module 1, the carrier material 5 passes through in particular a guide and/or pretensioning and/or joining module 10, which may include submodules for cleaning and/or deionising stations to neutralise any static charge of the carrier and remove any particles from the carrier. This may be followed by an upper coating module 6 and/or optionally a lower coating module 7 as the next module. In further embodiments, these modules may serve to remove covering films and expose the embossing compound. Modules 6 and 7 deliver the embossing compound in measured quantities, shape it, remove excess solvent and/or prepare it for embossing.

As the next module, the embossing module 2 may comprise the method according to the invention and auxiliary units.

Downstream modules may follow, such as module 12 and module 13, which may in particular apply a protective layer and/or a protective film and/or perform complete curing.

A further deionising station and/or a pretensioning and/or closed-loop control and/or guide module 11 may be interposed before the receiver module 4. The imprinting system 15 may be monitored and adjusted with a measurement and/or open-loop control and/or closed-loop control module or modules 14 for maintaining throughput rate, quality, process consistency and stability, for example. The networking of all modules with the open-loop and/or closed-loop control module 14 is indicated by dashed lines.

In a further embodiment of the imprinting system 15—not shown—it is possible combine individual modules with each other. For example, the imprinting module 2, the drive module 8 and/or the radiation module 9 may be integrated together. It is further possible to combine the transmission module 1 with the guide and/or pretensioning and/or joining module 10. A further possibility is the multiple integration of the transmission module 1 with the joining module 10 and also with the coating modules 6 and/or the coating module 7. This applies similarly for modules 11, 12, 13 and 4.

This modular construction makes it possible both to separate functions and to integrate functions, thereby producing an imprinting system 15 which is optimised for function and/or cost. Consequently, in a further embodiment of the imprinting system according to the invention it is possible that only the embossing module 2 is contained. Moreover, in another embodiment according to the invention a combination of the embossing module 2 with the open-loop control module 14 is conceivable. All possible permutations of at least one of the modules for the imprinting system 15 (particularly module 2) are to be considered disclosed.

REFERENCE SIGNS

A Section
n1, n2, n3 Refractive indices
G, H Boundary surfaces
M1, M2, O Media, bodies with different refractive indices
I, I1, I2, I3 Intensity of radiation, particularly light
x, k Distance
e Exponential function
c Boundary angle of total reflection
α, β Angles of refraction
F Embossing force
F' Counterforce
bp Width of the embossing roll
D External diameter of the embossing roll
L Coupled in radiation, particularly light
d Internal diameter of the embossing roll
s Reflective surface
lk Light coupling surface, particularly a cavity
t, t', t'', t''' Partition between the segments
1 Transmission module
2, 2', 2'', 2''', Embossing module, particularly embossing
2'''', 2''''', roll
2'''''', 2'''''''
2a Outer cylinder shell surface of the embossing roll
2i Inner functional shell surface of the embossing roll
2ik Inner functional shell surface of the embossing roll, shaped conically 2*k* Coupling surface (end face of the embossing roll) with coupling elements and partial mirroring
2*s* End face of the embossing roll (for coupling radiation in)
2*sp* Reflective end face of the embossing roll
3 Support module
4 Receiver module
5 Support shell
6 Upper coating module
7 Lower coating module
8 Force and pressure generating elements, particularly drives, motors
9 Radiation module with at least one radiation source
10 Guide and/or pretensioning and/or joining module for cleaning and/or deionising
11 Closed-loop control and/or guide module
12, 13 Modules for applying protective layer and/or protective film and/or complete curing module and/or pretensioning and/or deionising module
14 Measurement and/or open-loop and/or closed loop control module or modules
15 Imprinting system
16 Cylinder body
16*a* Outer shell surface of the cylinder body
16*k* Outer shell surface of the cylinder body, conical design
16*s* Disruption sites for forced coupling out of radiation at the outer shell surface of the cylinder body 16*a*
17 Embossing compound
18, 18' Beam shaper for coupling in, particularly optical wedges, lenses, prisms, mirrors, diaphragms Having described the invention, the following is claimed:

1. A method for embossing micro-structures and/or nano-structures, said method comprising:
   providing a structured embossing roll having end faces,
   coupling a crosslinking radiation into the structured embossing roll which is transparent for the crosslinking radiation, wherein the embossing roll functions as a light guide for the coupled in crosslinking radiation, wherein the crosslinking radiation is coupled in on at least one of the end faces of the embossing roll,
   providing a carrier having an embossing compound applied thereto,
   contacting the embossing roll with the embossing compound,
   coupling the crosslinking radiation out of the embossing roll, and
   curing the embossing compound which has been acted upon by the coupled out crosslinking radiation via the embossing roll.

2. The method according to claim 1, wherein the crosslinking radiation is coupled into the embossing roll by at least one transmission module.

3. The method according to claim 1, wherein the crosslinking radiation is UV radiation.

4. The method according to claim 1, wherein the method includes multiple total reflections of the crosslinking radiation taking place inside the embossing roll.

5. The method according to claim 1, wherein the method includes simultaneously
   (i) coupling the crosslinking radiation out of the embossing roll by frustrated total reflection, and
   (ii) coupling the crosslinking radiation into the embossing compound for the curing of the embossing compound.

6. The method according to claim 1, wherein the crosslinking radiation is coupled out of the embossing roll by scattering sites.

7. The method according to claim 1, wherein the method includes processing of the embossing compound using the embossing roll, wherein the curing of the embossing compound by the crosslinking radiation takes place with time delay after the processing of the embossing compound or simultaneously with the processing of the embossing compound.

8. An apparatus for embossing micro-structures and/or nano-structures, said apparatus comprising:
   a transmission module for transmitting a crosslinking radiation,
   an embossing roll having end faces, the embossing roll transparent for the crosslinking radiation and is configured to act upon an embossing compound applied to a carrier,
   wherein the crosslinking radiation is coupled in the embossing roll on at least one of the end faces of the embossing roll such that the embossing roll is usable as a light guide for the coupled in crosslinking radiation, and
   wherein the crosslinking radiation is coupled out of the embossing roll to cure the embossing compound that is acted upon by the embossing roll.

9. An embossing roll for processing an embossing compound applied to a carrier, said embossing roll comprising:
   an outer shell surface,
   an inner shell surface, and
   end faces, wherein at least one of the end faces of the embossing roll includes partial mirroring elements and/or grooves and/or notches for coupling in crosslinking radiation into the embossing roll.

10. The embossing roll according to claim 9, wherein the inner shell surface is conically shaped.

11. The embossing roll according to claim 9, wherein the crosslinking radiation is coupled into one side on one of the end faces of the embossing roll, and an opposite end face of the embossing roll is totally reflective.

* * * * *